(12) United States Patent
Chen et al.

(10) Patent No.: US 7,969,770 B2
(45) Date of Patent: Jun. 28, 2011

(54) PROGRAMMABLE VIA DEVICES IN BACK END OF LINE LEVEL

(75) Inventors: Kuan-Neng Chen, White Plains, NY (US); Lia Krusin-Elbaum, Dobbs Ferry, NY (US); Dennis M. Newns, Yorktown Heights, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 996 days.

(21) Appl. No.: 11/833,321

(22) Filed: Aug. 3, 2007

(65) Prior Publication Data

US 2009/0033358 A1 Feb. 5, 2009

(51) Int. Cl.
*G11C 11/00* (2006.01)
(52) U.S. Cl. .......................... 365/163; 365/148; 977/754
(58) Field of Classification Search .................... 365/46, 365/94, 100, 113, 129, 148, 163; 257/2–5, 257/296, E31.047, E27.006; 438/29, 95, 438/96, 166, 259, 365, 482, 486, 597; 977/753
See application file for complete search history.

(56) References Cited

U.S. PATENT DOCUMENTS

| | | | |
|---|---|---|---|
| 6,795,338 B2 | 9/2004 | Parkinson et al. | |
| 6,839,263 B2 | 1/2005 | Fricke et al. | |
| 6,967,344 B2 | 11/2005 | Ovshinsky et al. | |
| 7,057,923 B2 | 6/2006 | Furkay et al. | |
| 7,214,957 B2 | 5/2007 | Ryoo et al. | |
| 7,214,958 B2 | 5/2007 | Happ | |
| 2006/0097240 A1 | 5/2006 | Lowrey et al. | |
| 2006/0097343 A1 | 5/2006 | Parkinson | |
| 2007/0057341 A9 | 3/2007 | Pellizzer | |
| 2007/0096071 A1 | 5/2007 | Kordus et al. | |
| 2007/0099405 A1 | 5/2007 | Oliva et al. | |
| 2007/0121363 A1* | 5/2007 | Lung ............................. | 365/129 |

OTHER PUBLICATIONS

K.N. Chen et al., Thermal Stress Evaluation of a PCRAM Material Ge2Sb2Te5, 21st IEEE Non-Volatile Semiconductor Memory Workshop, pp. 97-98 (2006).

* cited by examiner

*Primary Examiner* — Richard Elms
*Assistant Examiner* — Harry W Byrne
(74) *Attorney, Agent, or Firm* — Vazken Alexanian; Michael J. Chang, LLC

(57) ABSTRACT

Programmable via devices and methods for the fabrication thereof are provided. In one aspect, a programmable via device is provided. The programmable via device comprises a first dielectric layer; at least one isolation layer over the first dielectric layer; a heater within the isolation layer; a capping layer over a side of the isolation layer opposite the first dielectric layer; at least one programmable via extending through the capping layer and at least a portion of the isolation layer and in contact with the heater, the programmable via comprising at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

19 Claims, 10 Drawing Sheets

PROGRAMMABLE VIA DEVICES IN BACK END OF LINE LEVEL

CROSS-REFERENCE TO RELATED APPLICATIONS

This application is related to the commonly owned U.S. application Ser. No. 11/770,455, entitled "CMOS-Process-Compatible Programmable Via Device," filed on Jun. 28, 2007, now U.S. Pat. No. 7,687,309, the commonly owned U.S. application Ser. No. 11/776,295, entitled "Four-Terminal Reconfigurable Devices," filed on Jul. 11, 2007, now U.S. Pat. No. 7,772,582, and the commonly owned U.S. application Ser. No. 11/833,354, entitled "Programmable Via Devices With Air Gap Isolation," filed herewith on the same day of Aug. 3, 2007, now U.S. Pat. No. 7,659,534. The contents of the preceding applications are incorporated herein by reference as fully set forth herein.

FIELD OF THE INVENTION

The present invention relates to reconfigurable circuits, and more particularly, to programmable via devices and methods for fabrication thereof. Background of the Invention Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange interconnections between the logic blocks.

Reconfigurable circuits are also expected to play a significant role in three-dimensional integration technology that is being currently developed. Three-dimensional integration fabricates multilayer structures that can form a single chip combination with different functionalities. In these multilayer (and multifunctional) systems, reconfigurable circuit connection is typically needed to provide controllable logic functionality, memory repair, data encryption, as well as other functions.

A programmable via is an enabling technology for high-performance reconfigurable logic applications without the trade offs in low logic gate density and power. Phase change materials are an attractive option for this application, but to date, have drawn the most attention from semiconductor memory developers as a possible replacement to flash memory.

Integrating programmable via technology with existing semiconductor architecture still presents a challenge, however, especially in the context of scaled process technology. For example, undesirable interactions of programmable via components with commonly employed semiconductor device materials can affect device performance, and thus present a problem.

Therefore, improved programmable via technology that is easily integratable with existing semiconductor device architecture would be desirable.

SUMMARY OF THE INVENTION

The present invention provides programmable via devices and methods for the fabrication thereof. In one aspect of the invention, a programmable via device is provided. The programmable via device comprises a first dielectric layer; at least one isolation layer over the first dielectric layer; a heater within the isolation layer; a capping layer over a side of the isolation layer opposite the first dielectric layer; at least one programmable via extending through the capping layer and at least a portion of the isolation layer and in contact with the heater, the programmable via comprising at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

In another aspect of the invention, a method of fabricating a programmable via device over a device layer of a semiconductor chip is provided. The method comprises the following steps. A first dielectric layer is deposited on the device layer. A first isolation layer is deposited over a side of the first dielectric layer opposite the device layer. A heater is formed on a side of the first isolation layer opposite the first dielectric layer. A second isolation layer is deposited over the side of the first isolation layer opposite the first dielectric layer so as to cover the heater. A first conductive via and a second conductive via are formed each extending through the second isolation layer and in contact with the heater. A capping layer is deposited over a side of the second isolation layer opposite the first isolation layer. At least one programmable via is formed extending through the capping layer and the second isolation layer and in contact with the heater, the programmable via comprising at least one phase change material. A conductive cap is formed over the programmable via. A second dielectric layer is deposited over a side of the capping layer opposite the second isolation layer. Each of the first conductive via and the second conductive via are extended through the capping layer and through the second dielectric layer. A third conductive via is formed extending through the second dielectric layer and in contact with the conductive cap.

In yet another aspect of the invention, a method of performing a logic function is provided. The method comprises the following steps. A programmable via device is provided. The programmable via device comprises a first dielectric layer; at least one isolation layer over the first dielectric layer; a heater within the isolation layer; a capping layer over a side of the isolation layer opposite the first dielectric layer; at least one programmable via extending through the capping layer and at least a portion of the isolation layer and in contact with the heater, the programmable via comprising at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap. An OFF switching pulse is passed through the heater, when the programmable via is in a conductive state, the OFF switching pulse being configured to amorphize at least a portion of the phase change material in the programmable via to switch the programmable via to a resistive state, and/or an ON switching pulse is passed through the heater, when the programmable via is in a resistive state, the ON switching pulse being configured to anneal at least a portion of the phase change material in the programmable via to switch the programmable via to a conductive state.

In still another aspect of the invention, an integrated logic circuit is provided. The integrated logic circuit comprises a plurality of logic blocks; and at least one programmable via device interconnecting two or more of the logic blocks. The programmable via device comprises a first dielectric layer; at least one isolation layer over the first dielectric layer; a heater within the isolation layer; a capping layer over a side of the isolation layer opposite the first dielectric layer; at least one programmable via extending through the capping layer and at least a portion of the isolation layer and in contact with the heater, the programmable via comprising at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

In a further aspect of the invention, a semiconductor chip is provided. The semiconductor chip comprises at least one device layer; and at least one programmable via device. The programmable via device comprises a first dielectric layer over the device layer; at least one isolation layer over a side of the first dielectric layer opposite the device layer; a heater within the isolation layer; a capping layer over a side of the isolation layer opposite the first dielectric layer; at least one programmable via extending through the capping layer and at least a portion of the isolation layer and in contact with the heater, the programmable via comprising at least one phase change material; a conductive cap over the programmable via; a second dielectric layer over a side of the capping layer opposite the isolation layer; a first conductive via and a second conductive via, each extending through the second dielectric layer, the capping layer and at least a portion of the isolation layer and in contact with the heater; and a third conductive via extending through the second dielectric layer and in contact with the conductive cap.

A more complete understanding of the present invention, as well as further features and advantages of the present invention, will be obtained by reference to the following detailed description and drawings.

DETAILED DESCRIPTION OF THE PREFERRED EMBODIMENTS

Figure 1:
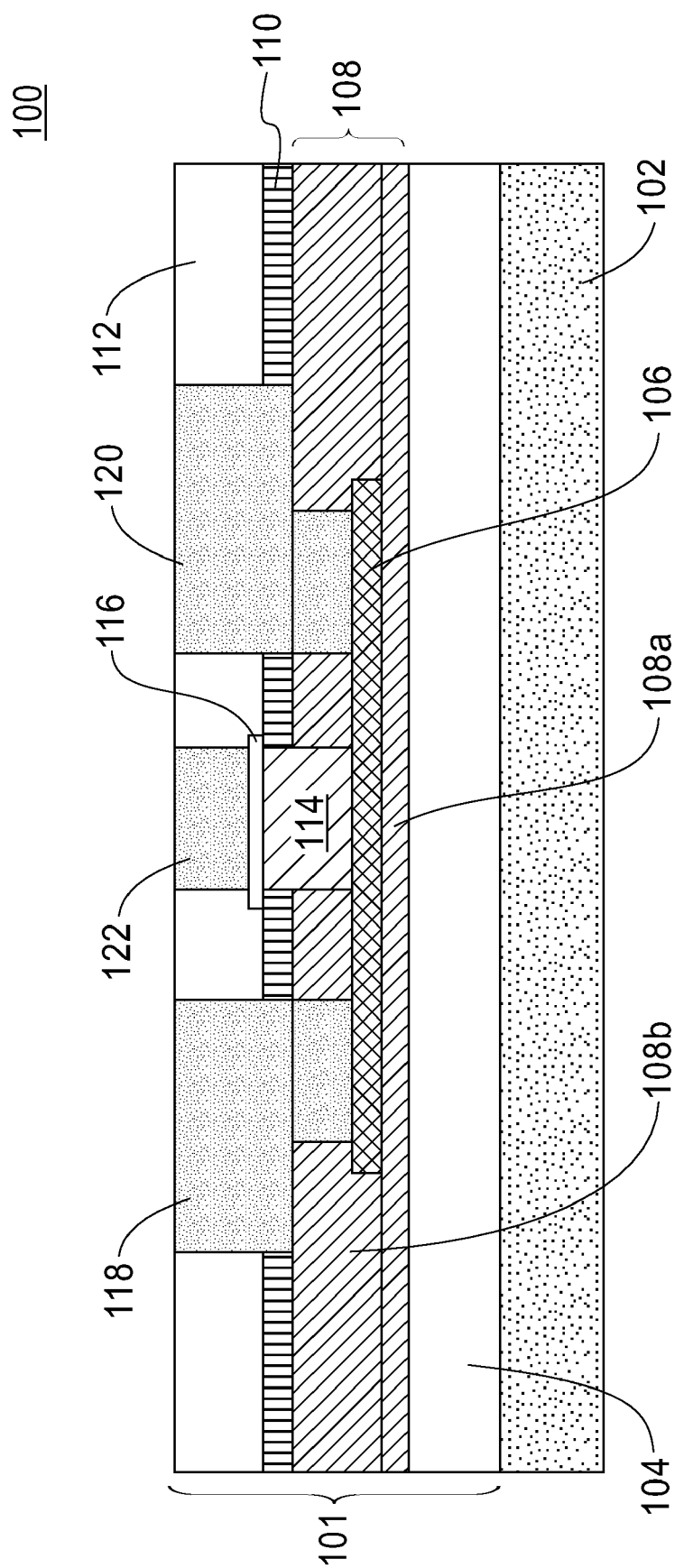
FIG. 1 is a diagram illustrating an exemplary semiconductor chip having a programmable via device placed in a back end of line (BEOL) level thereof according to an embodiment of the present invention.
Figure 2A:
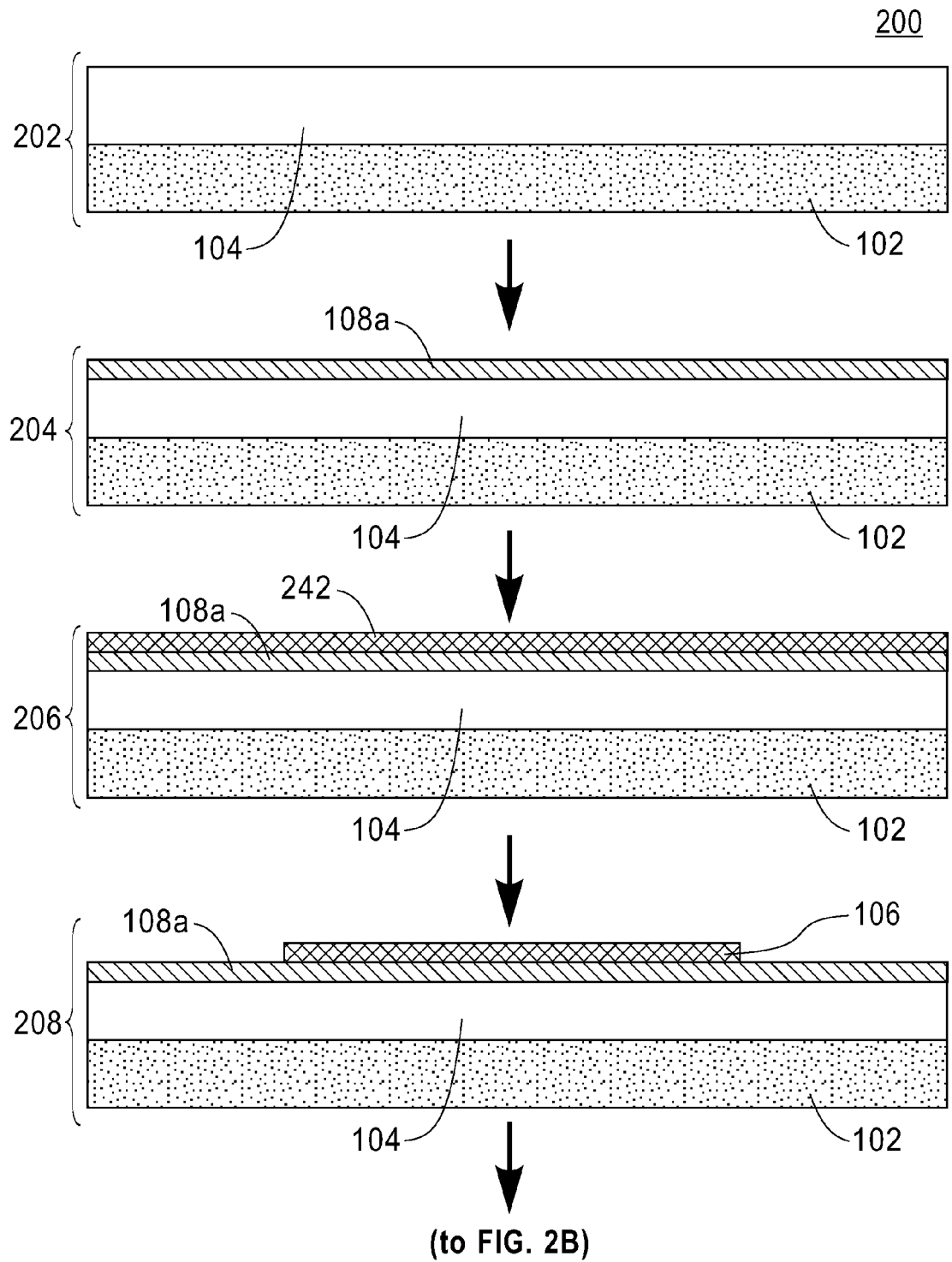
FIGS. 2A-E are diagrams illustrating an exemplary methodology for fabricating a programmable via device over a device layer of a semiconductor chip according to an embodiment of the present invention.
Figure 2B:
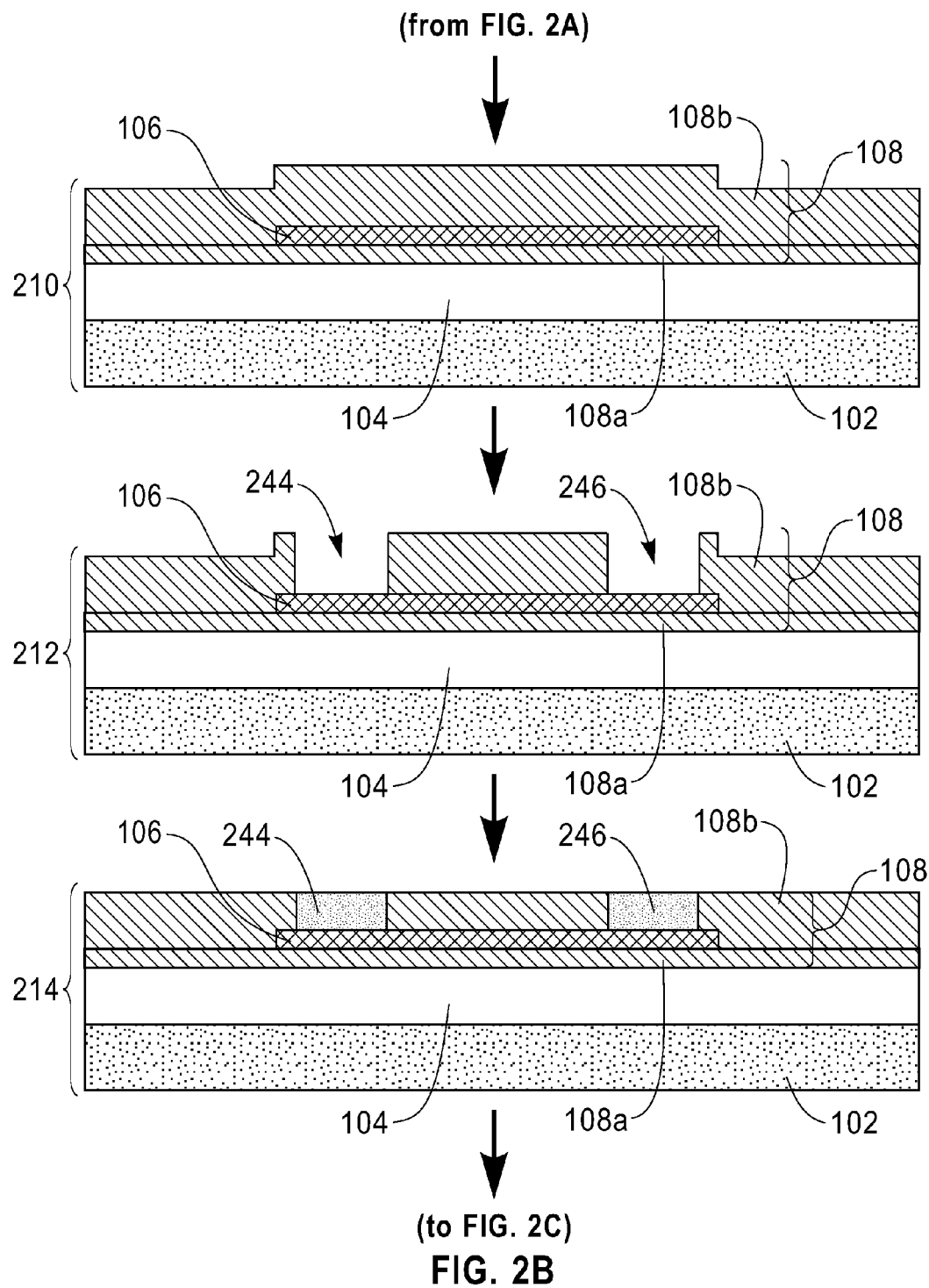
Figure 2C:
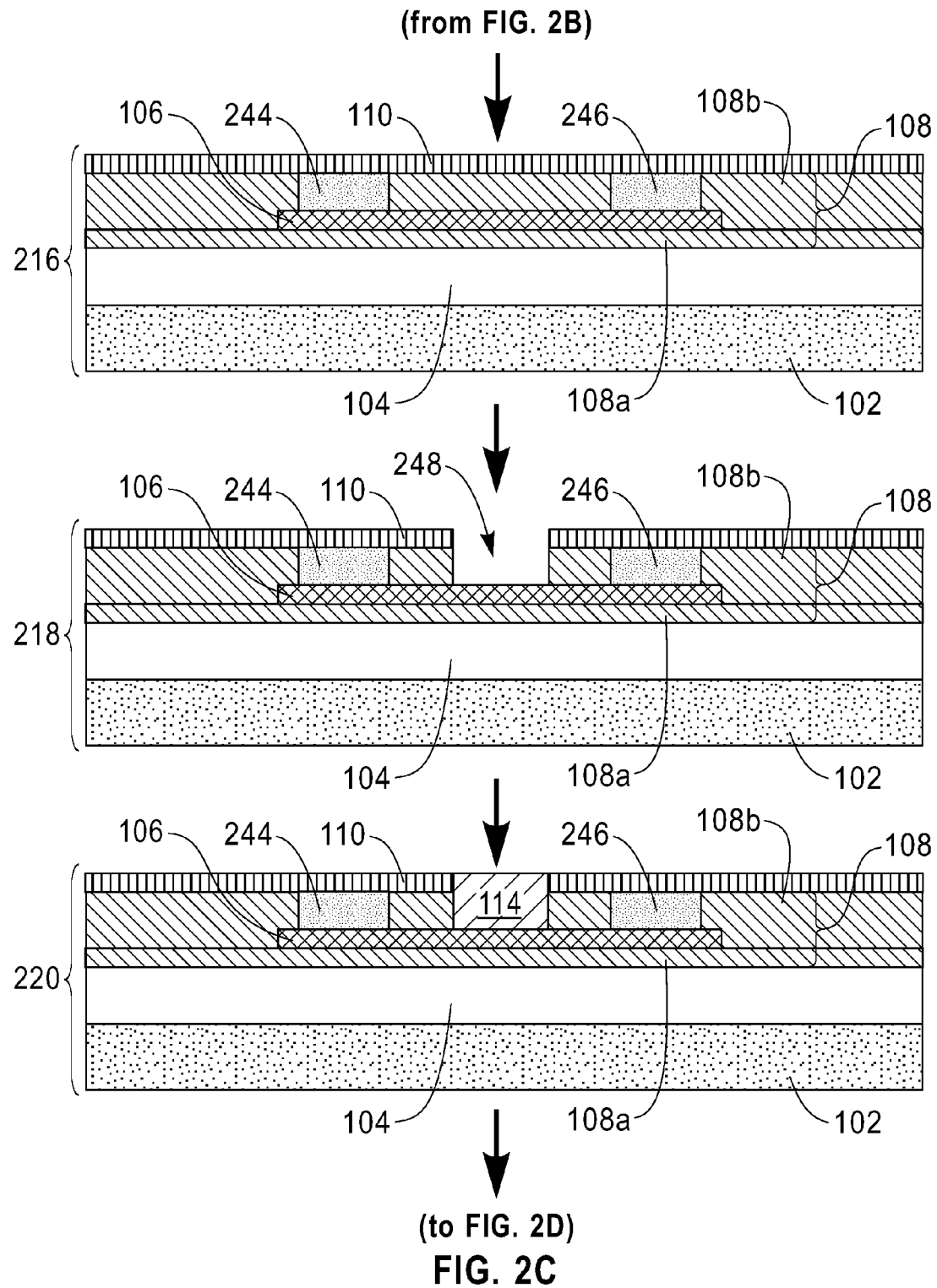
Figure 2D:
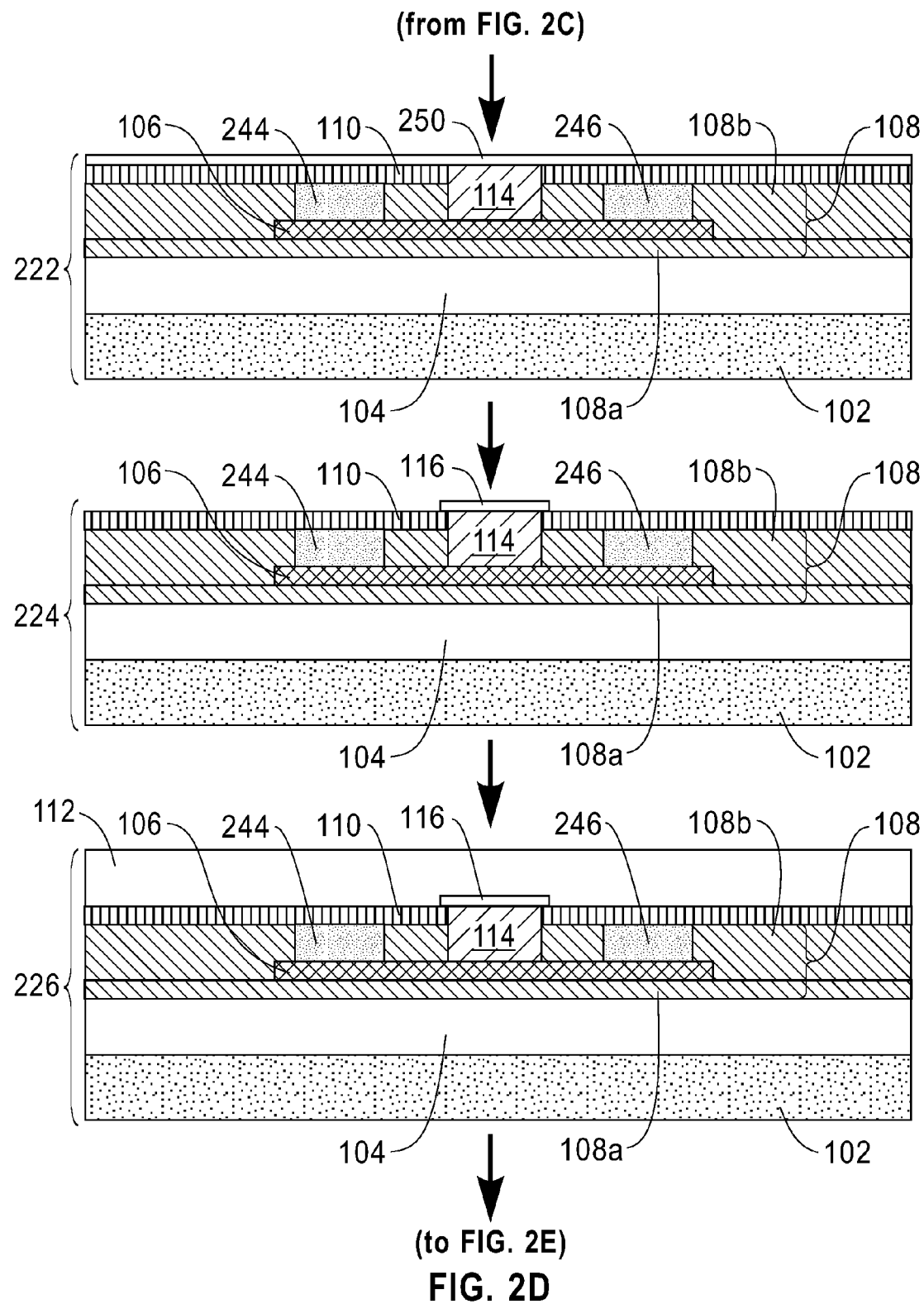
Figure 2E:
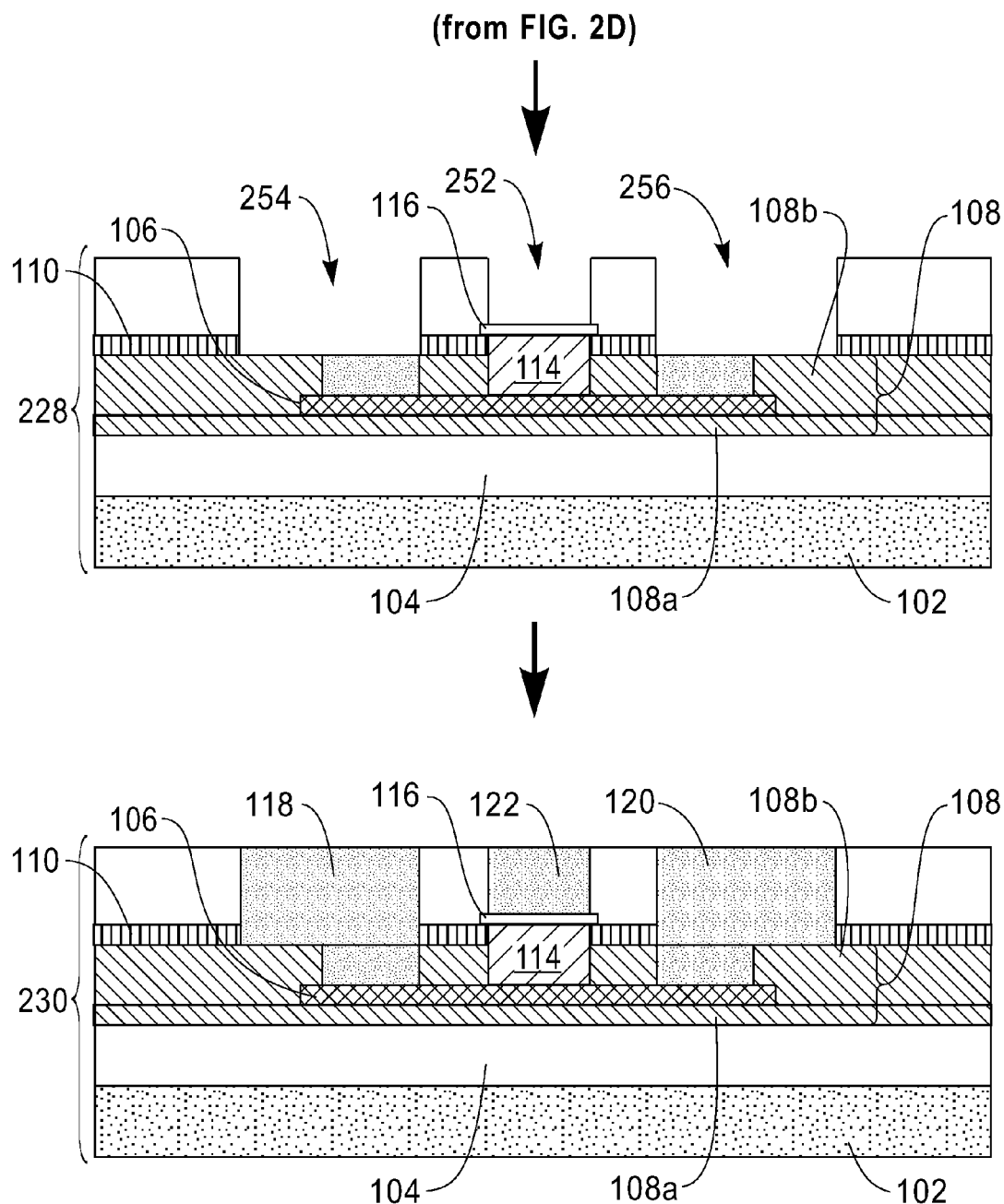

FIG. 1 is a diagram illustrating exemplary semiconductor chip 100. Semiconductor chip 100 comprises programmable via device 101 placed in a back end of line (BEOL) level thereof, i.e., over device layer 102. As will be described in detail below, the configuration of programmable via device 101 makes programmable via device 101 integratable with BEOL levels of a semiconductor chip.

The term "BEOL," as used herein, generally refers to a stage(s) of production of a semiconductor chip after first metallization. As such, the term "BEOL levels," as used herein, generally refers to portions, i.e., levels and/or layers, associated with a semiconductor chip after first metallization. Further, any portions, i.e., levels and/or layers, of the semiconductor chip fabricated up to, and including, first metallization (also known as front end of line "FEOL" levels) are collectively referred to herein as a "device layer(s)." Placing the programmable via device in BEOL levels of a chip is advantageous, as it prevents contamination of silicon components of the chip by the programmable via device materials, such as the phase change and heater materials (as described below).

Programmable via device 101 comprises dielectric layer 104, heater 106, isolation layer 108, capping layer 110, dielectric layer 112, programmable via 114, conductive cap 116 and conductive vias 118, 120 and 122. Specifically, dielectric layer 104 is present over device layer 102. Since, as described above, programmable via device 101 is located in BEOL levels of the chip, dielectric layer 104 comprises a BEOL dielectric material, including, but not limited to hydrogenated silicon oxycarbide (SiCOH). According to an exemplary embodiment, as will be described in detail below, dielectric layer 112 can also comprise a BEOL dielectric material, such as SiCOH, thus surrounding each side of the programmable via device with a BEOL dielectric layer.

During operation of the programmable via device, a large amount of heat passes through the heater/programmable via. By way of example only, current passing through the heater/programmable via can be greater than two milliamps (mA). The power through the heater can be up to about 6.8 milliwatts (mW) generating temperatures of greater than 600 degrees Celsius (° C.). This heat can cause material to diffuse out from these structures and contaminate surrounding structures/layers. Of particular concern are dielectric layers 104 and 112. SiCOH is an organosilicate network polymer-based material that can become contaminated, for example, by phase change material(s) (described below) that diffuse out from the programmable via and/or by refractory material(s) (described below) that diffuse out from the heater. Contamination of the dielectric layers can affect performance of the device. To address this concern, an isolation layer is employed surrounding heater 106/programmable via 114 to prevent diffusion of materials contained therein.

Namely, isolation layer 108 is present over a side of dielectric layer 104 opposite device layer 102. In general, isolation layer 108 can comprise any diffusion barrier material that blocks the diffusion of heater and/or programmable via phase change materials. Typically, the diffusion barrier material has a density that is greater than a density of dielectric layers 104/112. According to an exemplary embodiment, isolation layer 108 comprises one or more of amorphous hydrogenated silicon carbonitride (such as NBlok produced by Applied Materials, Santa Clara, Calif.), a low temperature oxide, silicon nitride (SiN) and amorphous silicon. Advantageously, each of these diffusion barrier materials can be utilized in accordance with BEOL process temperature requirements. As will be described in detail below, process temperatures employed herein during fabrication of the programmable via device are preferably configured to meet BEOL temperature requirements, e.g., so as not to cause any degradation of the BEOL dielectric materials.

Amorphous hydrogenated silicon carbonitride, which can be used to block copper (Cu) diffusion during various BEOL processes, can be deposited for BEOL structures, such as isolation layer 108, by plasma enhanced chemical vapor deposition (PECVD) at temperatures of less than about 400° C. Amorphous hydrogenated silicon carbonitride typically has a density of greater than one gram per cubic centimeter (g/cm$^3$).

According to the present teachings, low temperature oxides include oxide materials deposited at temperatures of less than about 500° C., such as silicon dioxide (SiO$_2$) which can be deposited using low pressure chemical vapor deposition (LPCVD) at temperatures of less than about 500° C. Low temperature oxides, which are denser than SiCOH, provide a good diffusion barrier. SiN, which can also be used to block Cu diffusion during various BEOL processes, can be deposited for BEOL structures, such as isolation layer 108, using PECVD at temperatures of about 400° C., or less. In addition to preventing diffusion of heater and/or programmable via phase change materials, isolation layer 108 can also prevent the ingress of external ambient gasses, such as oxygen, and moisture into the BEOL and programmable via structures during the fabrication process, and in use.

As will be described, for example, in conjunction with the description of FIG. 2, below, the process used to fabricate isolation layer 108 can comprise forming isolation layer 108 in two steps, as two layers, i.e., isolation layers 108a and 108b. Further, these two layers can have a same, or a different, composition as each other. For example, both isolation layers 108a and 108b can comprise a low temperature oxide.

Heater 106 is present within isolation layer 108. To achieve the best efficiency of electrical-thermal transformation and heat transport (i.e., from heater to programmable via), according to an exemplary embodiment heater 106 comprises a thin layer of a refractory material having a thickness of between about five nanometers (nm) and about 100 nm, with a relatively high resistivity of between about 100 ohm centimeter ($\Omega$ cm) and about 10,000 $\Omega$ cm, e.g., of between about 500 $\Omega$ cm and about 3,000 $\Omega$ cm. Suitable refractory materials include, but are not limited to, tantalum nitride (TaN) and metals having the formula $Ta_xSi_yN_z$, wherein x, y and z are each between zero and about one.

Capping layer 110 is present over a side of isolation layer 108 opposite dielectric layer 104. According to an exemplary embodiment, capping layer 110 comprises SiN. SiN is a preferred capping material because of its dielectric properties and effectiveness as an etch stop during fabrication (see description below).

Programmable via 114 extends through capping layer 110 and through a portion of isolation layer 108 and is in contact with heater 106. Programmable via 114 comprises a phase change material. Suitable phase change materials include, but are not limited to, one or more of ternary alloys of germanium (Ge), antimony (Sb) and tellurium (Te) (GST), such as $Ge_2Sb_2Te_5$, GeSb, GeSb$_4$, SbTe and doped derivatives thereof with substitution/addition of other elements, such as nitrogen (N) and Si. See also, U.S. application Ser. No. 11/393,270, ventitled "Programmable Via Structure for Three Dimensional Integration Technology," filed on Mar. 30, 2006, now U.S. Pat. No. 7,545,667. The contents of the preceding application are incorporated herein by reference. Programmable via devices, also sometimes referred to as reconfigurable devices having programmable vias, are further described in U.S. application Ser. No. 11/770,455, entitled "CMOS-Process-Compatible Programmable Via Device," filed on Jun. 28, 2007, now U.S. Pat. No. 7,687,309, in U.S. application Ser. No. 11/776,295, entitled "Four-Terminal Reconfigurable Devices," filed on Jul. 11, 2007, now U.S. Pat. No. 7,772,582, and in U.S. application Ser. No. 11/612,631, entitled "Programmable Via Structure and Method of Fabricating Same," filed on Dec. 19, 2006, now U.S. Pat. No. 7,652,278. The contents of the preceding applications are incorporated herein by reference.

Conductive cap 116 is present over programmable via 114. Conductive cap 116 extends laterally a distance beyond programmable via 114 to provide adequate coverage over programmable via 114, but not so far as to make contact with either conductive via 118 or conductive via 120. According to an exemplary embodiment, conductive cap 116 comprises a titanium nitride-titanium alloy (TiN/Ti). TiN/Ti provides both a good diffusion barrier between conductive via 122 and the phase change material in programmable via 114 and good adhesion and electrical conduction between conductive via 122 and the phase change material in programmable via 114.

Dielectric layer 112 is present over a side of capping layer 110 opposite isolation layer 108. Dielectric layer 112 can have a same composition as dielectric layer 104, or a different composition from dielectric layer 104. According to an exemplary embodiment, dielectric layer 112 has the same composition as dielectric layer 104, namely SiCOH. Programmable via device 101 would thus be covered on two sides, i.e., a top and a bottom thereof, with a BEOL dielectric layer. This configuration permits programmable via device 101 to be placed in any BEOL layer/level of semiconductor chip 100 (depending on the chip design) thus affording a great amount of flexibility for integrating the programmable via device into the chip architecture.

Each of conductive vias 118 and 120 extends through dielectric layer 112, through capping layer 110, through a portion of isolation layer 108 and is in contact with heater 106. Conductive vias 118 and 120 each comprise an electrically conductive material. Namely, conductive vias 118 and 120 can each comprise any suitable standard complementary-metal-oxide semiconductor (CMOS) process metal(s), including, but not limited to, one or more of tungsten (W), tantalum (Ta), TaN, titanium (Ti), titanium nitride (TiN) and Cu. Conductive via 122 extends through dielectric layer 112 and is in contact with conductive cap 116. Conductive via 122 also comprises an electrically conductive material. Like conductive vias 118 and 120, conductive via 122 can comprise any suitable standard CMOS process metal(s), including, but not limited to, one or more of W, Ta, TaN, Ti, TiN and Cu.

FIGS. 2A-E are diagrams illustrating exemplary methodology 200 for fabricating programmable via device 101 on device layer 102 of semiconductor chip 100. Semiconductor chip 100 having programmable via device 101 and device layer 102 was described, for example, in conjunction with the description of FIG. 1, above. The fabrication steps provided herein are CMOS process compatible, making implementation of the present techniques practical and economically viable, as well as favorable for scaled technology requirements.

In step 202, dielectric layer 104 is deposited on device layer 102. According to an exemplary embodiment, dielectric layer 104 comprises SiCOH (as described above) and is deposited on device layer 102 using any suitable deposition process, including, but not limited to, chemical vapor deposition (CVD). As described above, according to the present teachings, the process temperatures for forming BEOL structures, such as programmable via device 101 on semiconductor chip 100 meet BEOL temperature requirements. For example, the process temperatures are chosen so that the device layer is not subjected to undue thermal excursions. By way of example only, the BEOL processing temperatures used can be in the range of between about 350° C. and about 450° C. for forming the dielectric layers, and can be less than 250° C. for forming sacrificial layers, such as photoresist.

As highlighted above, isolation layer 108 (which prevents contamination of dielectric layers 104 and 112 from heater/programmable via materials) can be formed in a two-step process from two separate layers, i.e., isolation layer 108a and isolation layer 108b.Thus, in step 204, isolation layer 108a is deposited over a side of dielectric layer 104 opposite device layer 102. According to an exemplary embodiment, isolation layer 108a comprises one or more of amorphous hydrogenated silicon carbonitride, a low temperature oxide, SiN and amorphous silicon (as described above) and is deposited on dielectric layer 104 using a CVD technique e.g., LPCVD or PECVD. For example, as described above, isolation layer 108a can comprise amorphous hydrogenated silicon carbonitride and can be deposited on dielectric layer 104 using PECVD.

In step 206, heater material layer 242 is deposited on a side of isolation layer 108a opposite dielectric layer 104. According to an exemplary embodiment, heater material layer 242 comprises a refractory material (as described above) and is deposited on isolation layer 108a using one or more of reactive sputtering, a CVD technique (such as LPCVD) and atomic layer deposition (ALD). In step 208, heater material layer 242 is patterned to form heater 106. According to an exemplary embodiment, photolithography is used to pattern heater material layer 242, wherein a photoresist is deposited on heater material layer 242, masked and patterned with the footprint of heater 106. A conventional dry etch, such as reactive ion etching (RIE) is then used to form heater 106, with isolation layer 108a acting as an etch stop.

In step 210 isolation layer 108b is deposited over the side of isolation layer 108a opposite dielectric layer 104, so as to cover heater 106. According to an exemplary embodiment, isolation layer 108b comprises one or more of amorphous hydrogenated silicon carbonitride, a low temperature oxide, SiN and amorphous silicon (as described above) and is deposited on isolation layer 108a using a CVD technique, e.g., LPCVD or PECVD. For example, as described above, isolation layer 108b can comprise amorphous hydrogenated silicon carbonitride and can be deposited on isolation layer 108a using PECVD. As shown in step 210, isolation layer 108b takes on the topography of heater 106 on isolation layer 108a.Together, isolation layers 108a and 108b form isolation layer 108, which surrounds heater 106.

In step 212, vias 244 and 246 are formed through isolation layer 108b. According to an exemplary embodiment, vias 244 and 246 are formed using photolithography, wherein a photoresist is first deposited on isolation layer 108b,masked and patterned with each of the vias. RIE is then used to form vias 244 and 246, with heater 106 acting as an etch stop.

In step 214, vias 244 and 246 (formed in step 212, above) are filled with a suitable standard CMOS process metal(s), including, but not limited to, one or more of W, Ta, TaN, Ti, TiN and Cu (as described above), the metal making contact with heater 106. Chemical mechanical planarization (CMP) is then used to planarize vias 244/246 and isolation layer 108b.

In step 216, capping layer 110 is deposited over a side of isolation layer 108b opposite isolation layer 108a. According to an exemplary embodiment, capping layer 110 comprises SiN (as described above) and is deposited over isolation layer 108b using CVD.

In step 218, via 248 is formed through capping layer 110 and through isolation layer 108b.The process used to form via 248 can vary depending on the composition of isolation layer 108b.For example, according to an embodiment wherein isolation layer 108b comprises a low temperature oxide, via 248 is formed using photolithography in conjunction with a two-step etching process. First, a photoresist is deposited on capping layer 110, masked and patterned with the via. Nitride-selective RIE is used to form via 248 through capping layer 110, with isolation layer 108b acting as an etch stop. Oxide-selective RIE is then used to form via 248 through isolation layer 108b,with heater 106 acting as an etch stop.

In step 220, via 248 (formed in step 218, above) is filled with a phase change material (as described above), the phase change material making contact with heater 106. CMP is then used to planarize the phase change material in via 248, with capping layer 110 acting as an etch stop. As such, programmable via 114 is formed and is in contact with heater 106.

In step 222, conductive capping layer 250 is deposited over a side of capping layer 110 opposite isolation layer 108b. According to an exemplary embodiment, conductive capping layer 250 comprises TiN/Ti (as described above) and is deposited over capping layer 110 using CVD.

In step 224, conductive capping layer 250 is patterned to form conductive cap 116 covering and extending laterally a distance beyond programmable via 114, so as to provide adequate coverage over programmable via 114. According to an exemplary embodiment, conductive cap 116 is formed using photolithography, wherein a photoresist is deposited on conductive capping layer 250, masked and patterned with the footprint and location of conductive cap 116. RIE is then used to form conductive cap 116, with capping layer 110 acting as an etch stop.

In step 226, dielectric layer 112 is deposited over the side of capping layer 110 opposite isolation layer 108b. According to an exemplary embodiment, dielectric layer 112 comprises the same composition as dielectric layer 104, i.e., SiCOH (as described above) and is deposited over capping layer 110 using CVD.

In step 228, via 252 is formed through dielectric layer 112, and vias 254 and 256 are formed through dielectric layer 112 and capping layer 110. According to an exemplary embodiment, dielectric layer 112 comprises SiCOH, capping layer 110 comprises SiN and a two-step etching process is used to form vias 252, 254 and 256. Namely, a photoresist is deposited on dielectric layer 112, masked and patterned with each of the vias. Oxide-selective RIE is then used to etch vias 252 and 254/256 through dielectric layer 112, with conductive cap 116 and capping layer 110, respectively, acting as etch stops. Nitride-selective RIE is then used to etch vias 254/256 through capping layer 110.

In step 230, via 252, formed in step 228, above, is filled with a suitable standard CMOS process metal(s), including, but not limited to, one or more of W, Ta, TaN, Ti, TiN and Cu (as described above), the metal making contact with conductive cap 116. Each of vias 254 and 256, formed in step 228, above, are also filled with a suitable standard CMOS process metal(s), including, but not limited to, one or more of W, Ta, TaN, Ti, TiN and Cu (as described above). Since vias 254 and 256 in conjunction with vias 244 and 246 (formed in steps 212 and 214), respectively, will comprise conductive vias of the device, it is preferable that the same metal be used to fill vias 254/244 and vias 256/246.

CMP is then used to planarize the metal in each of conductive vias 252, 254 and 256, with dielectric layer 112 acting as an etch stop. As a result, via 254 extends via 244 to form conductive via 118, via 256 extends via 246 to form conductive via 120 and conductive via 122 is formed and is in contact with conductive cap 116. Programmable via device 101 is thus formed.

Figure 3A:
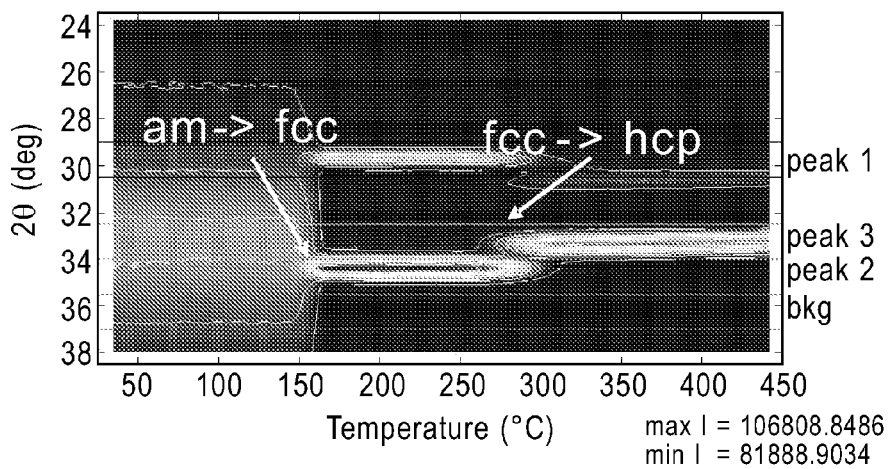
FIGS. 3A-C are graphs illustrating phase change material operation according to an embodiment of the present invention.
Figure 3B:
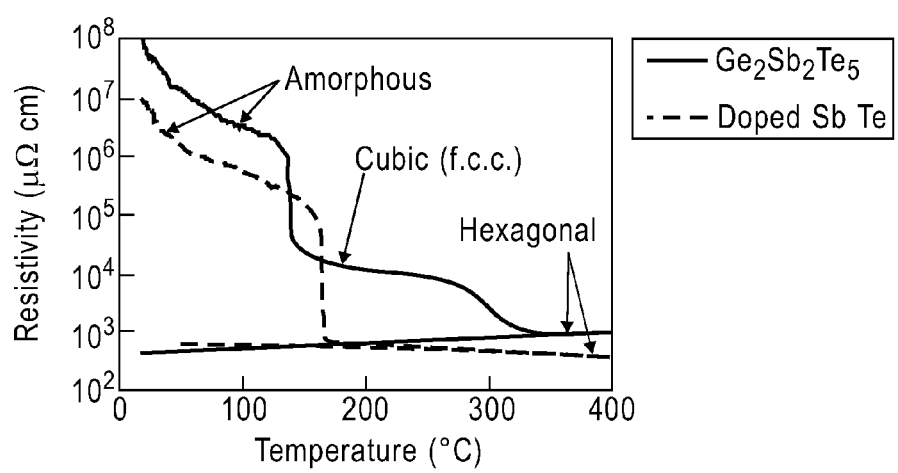
Figure 3C:
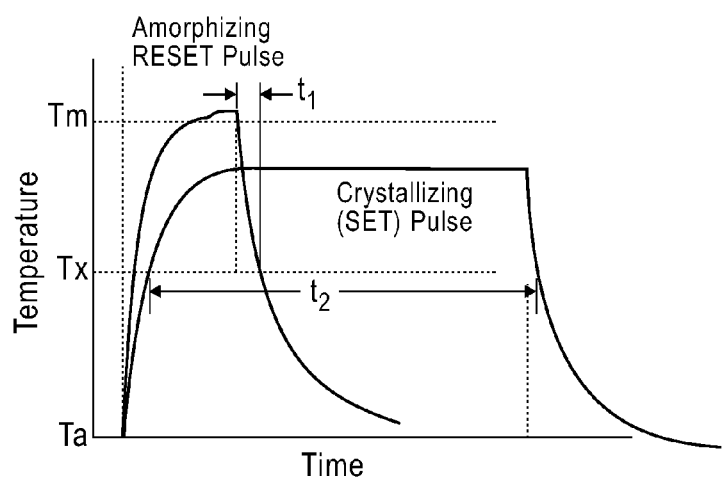

FIGS. 3A-C are graphs illustrating operation of a phase change material, such as the phase change material used in programmable via 114 of programmable via device 101, described, for example, in conjunction with the description of FIG. 1, above. FIG. 3A is a graph illustrating two theta (deg) (x-ray diffraction) evolution of the crystal structure of $Ge_2Sb_2Te_5$ from amorphous (no line), to face-centered cubic (fcc) to hexagonal close-packed (hcp) on heating (with temperature measured in ° C.). In FIG. 3A, at room temperature (e.g., about 27° C.), and up to moderately elevated temperatures (e.g., up to between about 400° C. and about 500° C.), the material is stable in two phases, a crystalline phase which is a moderately good conductor of electricity (i.e., about 200 microohms centimeter ($\mu\Omega$ cm)), and an amorphous phase which is insulating. FIG. 3B is a graph illustrating resistivity (measured in $\mu\Omega$ cm) versus temperature (measured in ° C.) for two phase change material samples, i.e., $Ge_2Sb_2Te_5$ and doped SbTe, showing different resistivities of different phases. The phases are interconverted by thermal cycling.

FIG. 3C is a graph illustrating thermal cycling for exemplary SET and RESET processes of the phase change material, as a function of temperature and time. The term "SET" and the term "RESET," as used herein, are intended to generally refer to switching the device to one of two opposite states. For example, the term "SET" may be used to describe the device being switched from an amorphous (OFF) to a crystallized (ON) state and the term "RESET" may be used to describe the device being switched from the crystallized (ON) to the amorphous (OFF) state, or vice versa. According to the exemplary embodiment shown in FIG. 3C, the thermal cycling comprises a "RESET" (or OFF) pulse and a "SET" (or ON) pulse. The "RESET" (or OFF) pulse involves a conversion from crystalline to amorphous form. In this step, the temperature is raised above melting, followed by a rapid quench in a time $t_1$ as a result of which a disordered arrangement of atoms in the melt is retained. The "SET" (or ON) pulse involves an anneal at a lower temperature, for a longer time $t_2$, which enables the amorphous form to crystallize.

Figure 4:
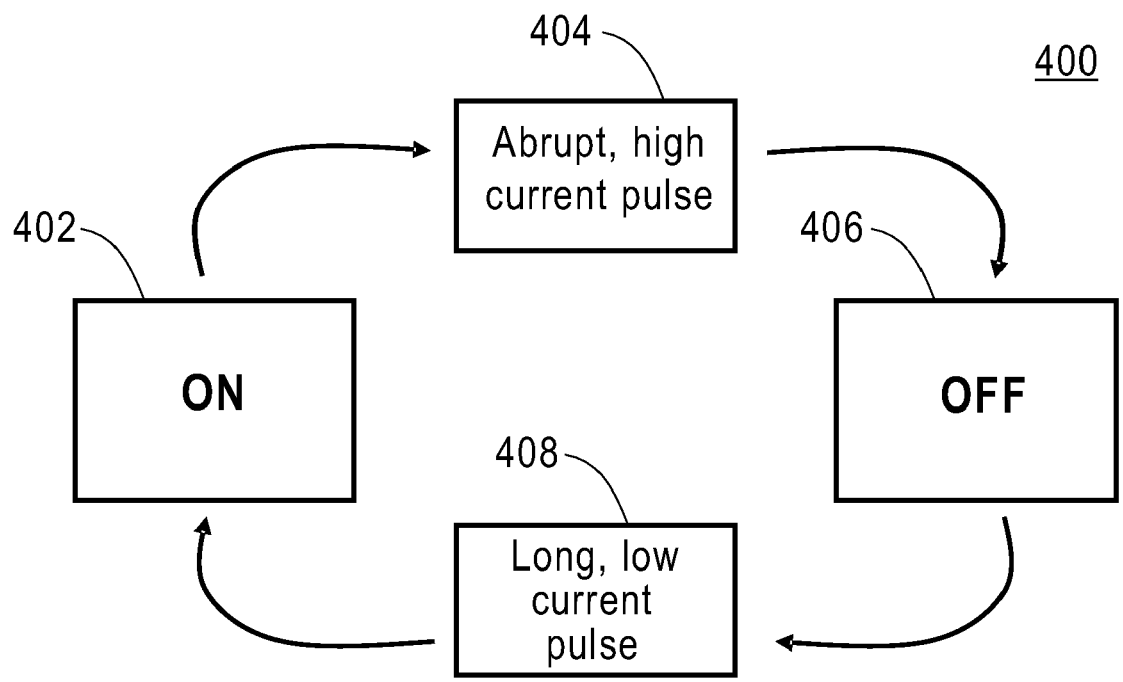
FIG. 4 is a diagram illustrating an exemplary methodology for performing a logic function with the programmable via device of FIG. 1 according to an embodiment of the present invention.

FIG. 4 is a diagram illustrating exemplary methodology 400 for performing a logic function with programmable via device 101, described, for example, in conjunction with the description of FIG. 1, above. The phase change material used in programmable via 114 can be switched between resistive (OFF-amorphous) and conductive (ON-crystalline) states by passing a current pulse through heater 106 which is in contact with a portion of programmable via 114.

Specifically, in step 402 programmable via device 101 is in an ON state. In step 404, an abrupt, e.g., a 10 nanosecond (ns) ramp up, a 50 ns plateau and a two ns ramp down, high-current, e.g., greater than one mA, pulse is passed through heater 106 (i.e., by way of conductive vias 118 and 120) to melt and quench/amorphize a thin region of the phase change material adjacent to the heater. OFF switching pulses are described in detail in conjunction with the description of FIG. 5, below. Another exemplary OFF switching pulse can comprise a 19 ns ramp up, a 20 ns plateau and a two ns ramp down, at a current of greater than one mA.

As described above, the term "SET" and the term "RESET," as used herein, are intended to generally refer to switching the device to one of two opposite states. Therefore, step 404 can be either a SET or a RESET switching process. By way of example only, if step 404 is considered a SET switching process, then step 408 (described below) is a RESET switching process. Similarly, if step 404 is considered a RESET switching process, then step 408 is a SET switching process In step 406, programmable via device 101 is now in a resistive (OFF-amorphous) state, and can remain in the OFF state until switched again. In step 408, an ON switching operation is accomplished by applying a relatively low current, e.g., less than or equal to about 0.5 mA, longer pulse, e.g., a 200 ns ramp up, a 1,000 ns plateau and a 200 ns ramp down, through heater 106 (i.e., by way of conductive vias 118 and 120) to anneal the amorphous phase change material to a crystalline state. ON switching pulses are described in detail in conjunction with the description of FIG. 6, below. Programmable via device 101 is now back in the conductive (ON-crystalline) state. The state of programmable via device 101, resistive or conductive, can be read through conductive vias 120 and 122.

Figure 5:
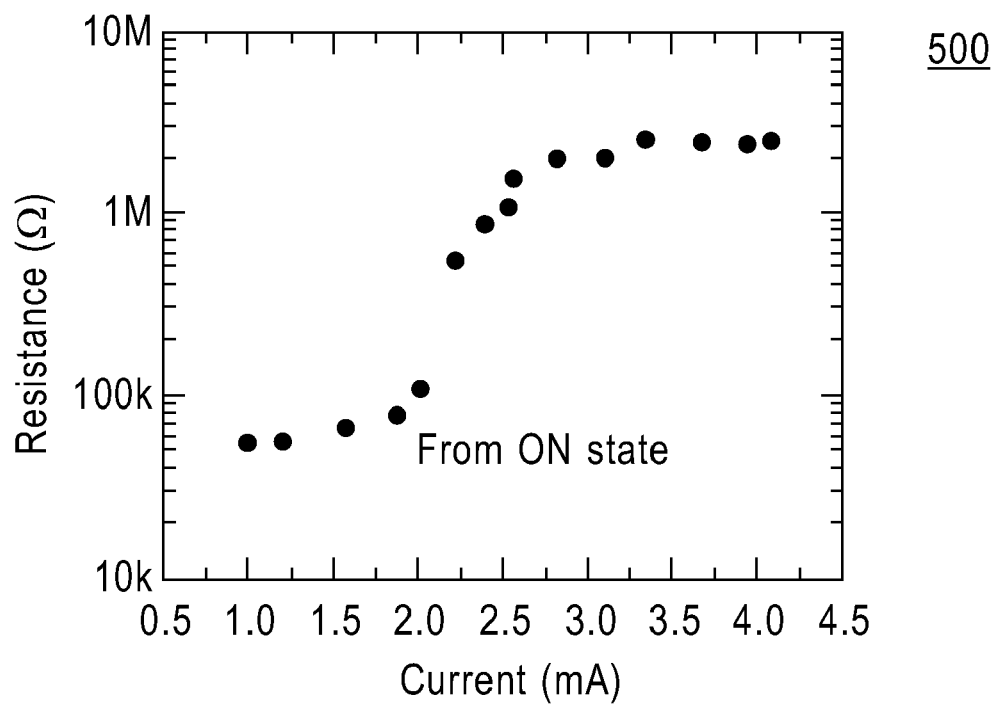
FIG. 5 is a graph illustrating resistance-current (R-I) characteristics for switching the programmable via device of FIG. 1 to an OFF state according to an embodiment of the present invention.

FIG. 5 is a graph 500 illustrating resistance-current (R-I) characteristics for switching programmable via device 101, described, for example, in conjunction with the description of FIG. 1, above, to an OFF state. According to an exemplary embodiment, 50 ns pulses with gradually increased power were applied to heater 106 from the ON state. Specifically, a 10 ns ramp up, a 50 ns plateau and a two ns ramp down were employed. After each pulse, programmable via device 101 was switched back to the ON state. When the pulse current reached about two milliamps (mA), the programmable via resistance started to increase and finally reached the OFF state.

Figure 6:
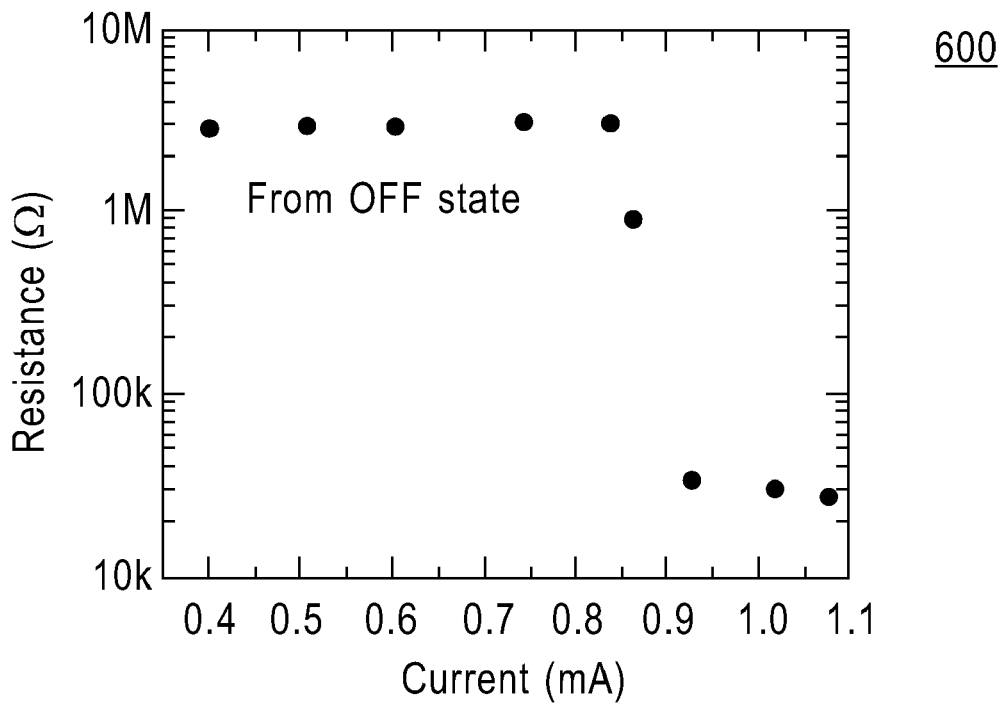
FIG. 6 is a graph illustrating R-I characteristics for switching the programmable via device of FIG. 1 to an ON state according to an embodiment of the present invention.

FIG. 6 is a graph 600 illustrating R-I characteristics for switching programmable via device 101, described, for example, in conjunction with the description of FIG. 1, above, to an ON state. Starting from an OFF state, one microsecond ($\mu$s) pulses with gradually increased power were applied to heater 106, finally implementing switching of the device to the ON state. Specifically, a 200 ns ramp up, a 1,000 ns plateau and then a 200 ns ramp down were employed.

Figure 7:
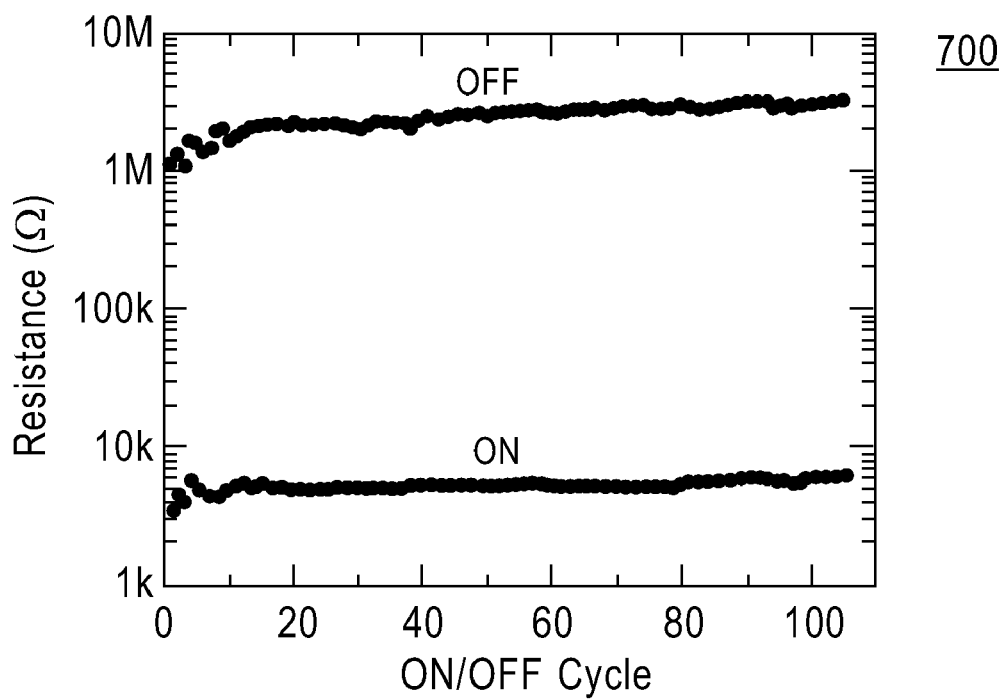
FIG. 7 is a graph illustrating cycling data from an endurance test of the programmable via device of FIG. 1 performed at room temperature according to an embodiment of the present invention.

FIG. 7 is a graph 700 illustrating cycling data from an endurance test performed on programmable via device 101, described, for example, in conjunction with the description of FIG. 1, above, at room temperature. The endurance test results show a stable sense margin without obvious degradation within the ON/OFF cycles.

Figure 8:
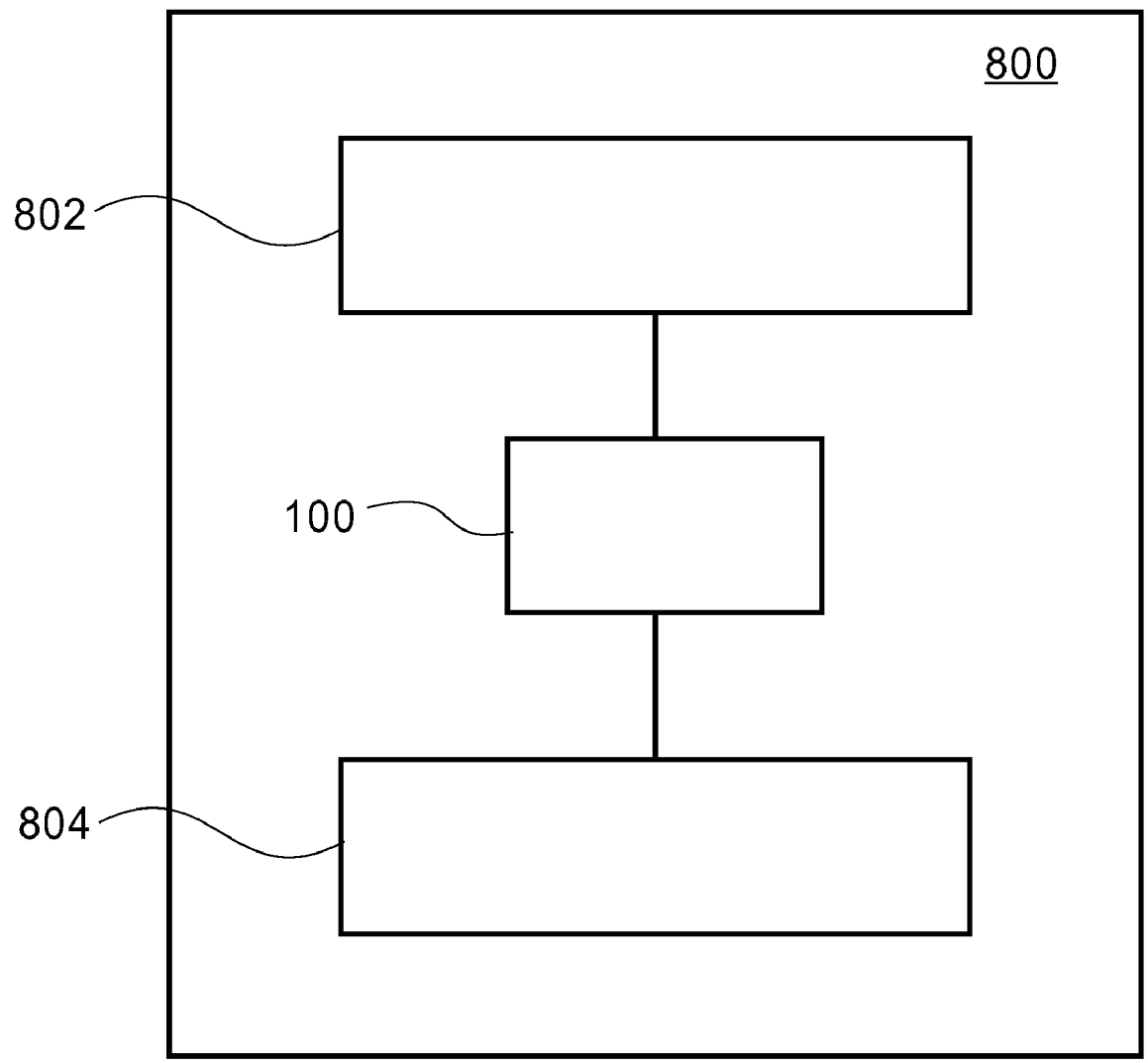
FIG. 8 is a diagram illustrating an exemplary integrated logic circuit according to an embodiment of the present invention.

FIG. 8 is a diagram illustrating exemplary integrated logic circuit 800. Integrated logic circuit 800 comprises logic block 802 associated with logic block 804 by way of a programmable via device, such as programmable via device 101 described in conjunction with the description of FIG. 1, above, therebetween. Logic blocks 802 and 804 can represent some of the components present in device layer 102 of semiconductor chip 100 (described, for example, in conjunction with the description of FIG. 1, above). According to an exemplary embodiment, integrated logic circuit 800 comprises a field programmable gate array (FPGA).

As described above, programmable via device 101 can be switched between a conductive and a resistive state. Thus, when programmable via device 101 is in a conductive state, logic block 802 is connected to logic block 804. Conversely, when programmable via device 101 is in a resistive state, the connection between logic blocks 802 and 804 is severed. Integrated logic circuit 800 can comprise a plurality of programmable via devices 101 to provide a variety of (reconfigurable) circuit configurations.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A programmable via device comprising:
    a first dielectric layer;
    at least one isolation layer over the first dielectric layer;
    a heater within the isolation layer;
    a capping layer over a side of the isolation layer opposite the first dielectric layer;
    at least one programmable via extending through the capping layer and at least a portion of the isolation layer and in contact with the heater, the programmable via comprising at least one phase change material;
    a conductive cap over the programmable via;
    a second dielectric layer over a side of the capping layer opposite the isolation layer;
    a first conductive via and a second conductive via, each extending through the second dielectric layer, the capping layer and at least a portion of the isolation layer and in contact with the heater; and
    a third conductive via extending through the second dielectric layer and in contact with the conductive cap.

2. The device of claim 1, wherein the first dielectric layer and the second dielectric layer each comprises a back end of line dielectric material.

3. The device of claim 1, wherein the first dielectric layer and the second dielectric layer have a same composition as each other.

4. The device of claim 1, wherein the first dielectric layer and the second dielectric layer each comprise hydrogenated silicon oxycarbide.

5. The device of claim 1, wherein the isolation layer comprises one or more of amorphous hydrogenated silicon carbonitride, a low temperature oxide, silicon nitride and amorphous silicon.

6. The device of claim 1, wherein the isolation layer comprises two separate isolation layers having a same composition as each other.

7. The device of claim 1, wherein the isolation layer comprises two separate isolation layers having a different composition from each other.

8. The device of claim 1, wherein the heater comprises at least one refractory material.

9. The device of claim 8, wherein the refractory material comprises one or more of tantalum nitride and a metal having a formula $Ta_xSi_yN_z$, wherein x, y and z are each between zero and about one.

10. The device of claim 8, wherein the refractory material has a resistivity of between about 500 ohm centimeter and about 3,000 ohm centimeter.

11. The device of claim 1, wherein the heater has a thickness of between about five nanometers and about 100 nanometers.

12. The device of claim 1, wherein the capping layer comprises silicon nitride.

13. The device of claim 1, wherein the phase change material comprises one or more of ternary alloys of germanium (Ge), antimony (Sb) and tellurium (Te) (GST), $Ge_2Sb_2Te_5$, GeSb, $GeSb_4$, SbTe and derivatives thereof doped with one or more of nitrogen and silicon.

14. The device of claim 1, wherein the conductive cap comprises a titanium nitride-titanium alloy.

15. The device of claim 1, wherein the conductive cap extends laterally a distance beyond the programmable via.

16. The device of claim 1, wherein the first conductive via, the second conductive via and the third conductive via each comprise one or more of tungsten, tantalum, tantalum nitride, titanium, titanium nitride and copper.

17. A method of performing a logic function, the method comprising the steps of:
    providing a programmable via device comprising:
        a first dielectric layer;
        at least one isolation layer over the first dielectric layer;
        a heater within the isolation layer;
        a capping layer over a side of the isolation layer opposite the first dielectric layer;
        at least one programmable via extending through the capping layer and at least a portion of the isolation layer and in contact with the heater, the programmable via comprising at least one phase change material;
        a conductive cap over the programmable via;
        a second dielectric layer over a side of the capping layer opposite the isolation layer;
        a first conductive via and a second conductive via, each extending through the second dielectric layer, the capping layer and at least a portion of the isolation layer and in contact with the heater; and
        a third conductive via extending through the second dielectric layer and in contact with the conductive cap; and
    passing one or more of:
        an OFF switching pulse through the heater, when the programmable via is in a conductive state, the OFF switching pulse being configured to amorphize at least a portion of the phase change material in the programmable via to switch the programmable via to a resistive state, and
        an ON switching pulse through the heater, when the programmable via is in a resistive state, the ON switching pulse being configured to anneal at least a portion of the phase change material in the programmable via to switch the programmable via to a conductive state.

18. An integrated logic circuit comprising:
    a plurality of logic blocks; and
    at least one programmable via device interconnecting two or more of the logic blocks, the programmable via device comprising:
        a first dielectric layer;
        at least one isolation layer over the first dielectric layer;
        a heater within the isolation layer;
        a capping layer over a side of the isolation layer opposite the first dielectric layer;
        at least one programmable via extending through the capping layer and at least a portion of the isolation layer and in contact with the heater, the programmable via comprising at least one phase change material;
        a conductive cap over the programmable via;
        a second dielectric layer over a side of the capping layer opposite the isolation layer;
        a first conductive via and a second conductive via, each extending through the second dielectric layer, the capping layer and at least a portion of the isolation layer and in contact with the heater; and a third conductive via extending through the second dielectric layer and in contact with the conductive cap.

19. A semiconductor chip, comprising:

at least one device layer; and at least one programmable via device, the programmable via device comprising:

a first dielectric layer over the device layer;

at least one isolation layer over a side of the first dielectric layer opposite the device layer;

a heater within the isolation layer;

a capping layer over a side of the isolation layer opposite the first dielectric layer;

at least one programmable via extending through the capping layer and at least a portion of the isolation layer and in contact with the heater, the programmable via comprising at least one phase change material;

a conductive cap over the programmable via;

a second dielectric layer over a side of the capping layer opposite the isolation layer;

a first conductive via and a second conductive via, each extending through the second dielectric layer, the capping layer and at least a portion of the isolation layer and in contact with the heater; and a third conductive via extending through the second dielectric layer and in contact with the conductive cap.

* * * * *